(12) United States Patent
Yoshida

(10) Patent No.: US 11,174,430 B2
(45) Date of Patent: Nov. 16, 2021

(54) FLUORIDE FLUORESCENT MATERIAL, LIGHT EMITTING DEVICE, AND METHOD FOR PRODUCING FLUORIDE FLUORESCENT MATERIAL

(71) Applicant: NICHIA CORPORATION, Anan (JP)

(72) Inventor: Tomokazu Yoshida, Anan (JP)

(73) Assignee: NICHIA CORPORATION, Anan (JP)

( * ) Notice: Subject to any disclaimer, the term of this patent is extended or adjusted under 35 U.S.C. 154(b) by 16 days.

(21) Appl. No.: 16/724,485

(22) Filed: Dec. 23, 2019

(65) Prior Publication Data

US 2020/0208050 A1    Jul. 2, 2020

(30) Foreign Application Priority Data

Dec. 26, 2018  (JP) ............................. JP2018-243489

(51) Int. Cl.
  *C09K 11/67*  (2006.01)
  *H01L 33/50*  (2010.01)

(52) U.S. Cl.
  CPC .......... *C09K 11/677* (2013.01); *H01L 33/502* (2013.01); *H01L 33/507* (2013.01); *H01L 2933/0041* (2013.01)

(58) Field of Classification Search
  CPC ..... H01L 33/50–508; H01L 2933/0041; H01L 33/502; H01L 33/507; C09K 11/677; C09K 11/665
  USPC .......................................................... 257/98
  See application file for complete search history.

(56) References Cited

U.S. PATENT DOCUMENTS

| 9,371,481 B2 | 6/2016 | Garcia et al. |
| 9,385,282 B2 | 7/2016 | Setlur et al. |
| 9,567,516 B2 | 2/2017 | Murphy et al. |
| 2015/0361335 A1* | 12/2015 | Murphy ............... C09K 11/616 362/97.1 |

(Continued)

FOREIGN PATENT DOCUMENTS

| CN | 105505384 A | 4/2016 |
| CN | 107573934 A | 1/2018 |

(Continued)

OTHER PUBLICATIONS

Wei et al., A low-temperature co-precipitation approach to synthesize ?uoride phosphors K2MF6:Mn4+ (M ¼Ge, Si) for white LED applications, Journal of Materials Chemistry C 2015, vol. 3, p. 1655-1660.

(Continued)

*Primary Examiner* — Jonathan Han
(74) *Attorney, Agent, or Firm* — Hunton Andrews Kurth LLP

(57) ABSTRACT

A fluoride fluorescent material includes a composition including K, Ge, $Mn^{4+}$, and F and having a molar ratio of K of 2, a total molar ratio of Ge and $Mn^{4+}$ of 1, a molar ratio of $Mn^{4+}$ of more than 0 and less than 0.2, and a molar ratio of F of 6 in 1 mol of the composition, has a light emission spectrum having a first light emission peak in a range of 615 nm or more and less than 625 nm having a full width at half maximum of 6 nm or less, and a second light emission peak in a range of 625 nm or more and less than 635 nm, and has an internal quantum of 85% or more efficiency under excitation of light having a wavelength of 450 nm.

10 Claims, 8 Drawing Sheets

(56) References Cited

U.S. PATENT DOCUMENTS

| | | | |
|---|---|---|---|
| 2015/0361336 A1 | 12/2015 | Garcia et al. | |
| 2015/0364655 A1 | 12/2015 | Setlur et al. | |
| 2016/0122633 A1 | 5/2016 | Kaneyoshi et al. | |
| 2016/0133799 A1* | 5/2016 | Park | H01L 33/502 257/98 |
| 2016/0186053 A1* | 6/2016 | Min | C09K 11/025 252/301.4 F |
| 2016/0340579 A1* | 11/2016 | Lin | G02F 1/1336 |
| 2017/0190968 A1* | 7/2017 | Zhou | C30B 29/12 |
| 2018/0305612 A1* | 10/2018 | Hong | H01L 33/502 |
| 2019/0140148 A1* | 5/2019 | Yoshimura | C09K 11/0883 |
| 2020/0199445 A1 | 6/2020 | Yoshida | |

FOREIGN PATENT DOCUMENTS

| | | |
|---|---|---|
| JP | 2010209311 A | 9/2010 |
| JP | 2017520641 A | 7/2017 |
| JP | 2017520644 A | 7/2017 |
| JP | 2017521511 A | 8/2017 |
| JP | 2020100702 A | 7/2020 |

OTHER PUBLICATIONS

A.G. Paulusz, "Efficient Mn (IV) Emission in Fluorine Coorination", J Electrochem. Soc., ; Solid-State Science and Technology, vol. 120, No. 7, 1973, p. 942-947.

\* cited by examiner

FLUORIDE FLUORESCENT MATERIAL, LIGHT EMITTING DEVICE, AND METHOD FOR PRODUCING FLUORIDE FLUORESCENT MATERIAL

CROSS-REFERENCE TO RELATED PATENT APPLICATION

This application claims priority to Japanese Patent Application No. 2018-243489, filed on Dec. 26, 2018, the disclosure of which is hereby incorporated reference in its entirety.

BACKGROUND

Technical Field

The present disclosure relates to a fluoride fluorescent material, a light emitting device using the same, and a method for producing a fluoride fluorescent material.

Description of Related Art

Various light emitting devices have been developed that emit light in white color, bulb color, orange color, through combination of a light emitting element, such as a light emitting diode (LED), and a fluorescent material. The light emitting device of this type emits mixed light in white color by mixing red light, green light, and blue light, i.e., the three primary colors of light, through combination, for example, of a light emitting device that emits light on the short wavelength side corresponding to ultraviolet light to visible light, and fluorescent materials that emit red, green, and blue light. The light emitting device of this type is being used in a wide variety of fields including general illuminations, vehicle illuminations, displays, backlights for liquid crystal display devices. For example, the fluorescent material that is used in a light emitting device for the purpose of a backlight for a liquid crystal display device is demanded to have a good chromatic purity, i.e., a small full width at half maximum of the light emission peak, for reproducing a wide range of colors in the chromaticity coordinates. The full width at half maximum means the full width at half maximum (FWHM) of the light emission peak in the light emission spectrum, which means the wavelength width of the light emission peak at 50% of the maximum value of the light emission peak in the light emission spectrum.

As the fluorescent material that emits red light having a small full width at half maximum, for example, Japanese Unexamined Patent Publication No. 2010-209311 describes a fluoride fluorescent material having a composition represented by $K_2SiF_6:Mn^{4+}$. NPL 1 describes the light emission mechanism of a fluoride fluorescent material activated with $Mn^{4+}$.

CITATION LIST

Non-Patent Literature

NPL 1: A. G. Paulusz, "Efficient Mn(IV) Emission in Fluorine Coordination", J. Electrochem. Soc.; SOLID-STATE SCIENCE AND TECHNOLOGY, Vol. 120, No. 7, 1973, p. 942-947

SUMMARY

There has been a demand of further enhancement of the light emission intensity of the fluoride fluorescent material emitting red light activated with $Mn^{4+}$.

Under the circumstances, an embodiment of the present disclosure provides a fluoride fluorescent material having an enhanced light emission intensity, a light emitting device using the same, and a method for producing a fluoride fluorescent material.

The present disclosure encompasses the following embodiments.

A first embodiment of the present disclosure relates to a fluoride fluorescent material including a composition including K, Ge, $Mn^{4+}$, and F and having a molar ratio of K of 2, a total molar ratio of Ge and $Mn^{4+}$ of 1, a molar ratio of $Mn^{4+}$ of more than 0 and less than 0.2, and a molar ratio of F of 6 in 1 mol of the composition, the fluoride fluorescent material having a light emission spectrum having a first light emission peak in a range of 615 nm or more and less than 625 nm having a full width at half maximum of 6 nm or less, and a second light emission peak in a range of 625 nm or more and less than 635 nm, and having an internal quantum efficiency of 85% or more under excitation of light having a wavelength of 450 nm.

A second embodiment of the present disclosure relates to a light emitting device including the aforementioned fluoride fluorescent material and an excitation light source having a light emission peak in a range of 380 nm or more and 485 nm or less.

A third embodiment of the present disclosure relates to a method for producing a fluoride fluorescent material, including: preparing fluoride particles including a composition including K, Ge, $Mn^{4+}$, and F and having a molar ratio of K of 2, a total molar ratio of Ge and $Mn^{4+}$ of 1, a molar ratio of $Mn^{4+}$ of more than 0 and less than 0.2, and a molar ratio of F of 6 in 1 mol of the composition; and bringing the fluoride particles into contact with a fluorine-containing substance, and subjecting to a heat treatment at a temperature of 400° C. or more.

According to the aforementioned embodiments, a fluoride fluorescent material having an enhanced light emission intensity, a light emitting device using the same, and a method for producing a fluoride fluorescent material can be provided.

DETAILED DESCRIPTION

Figure 1:
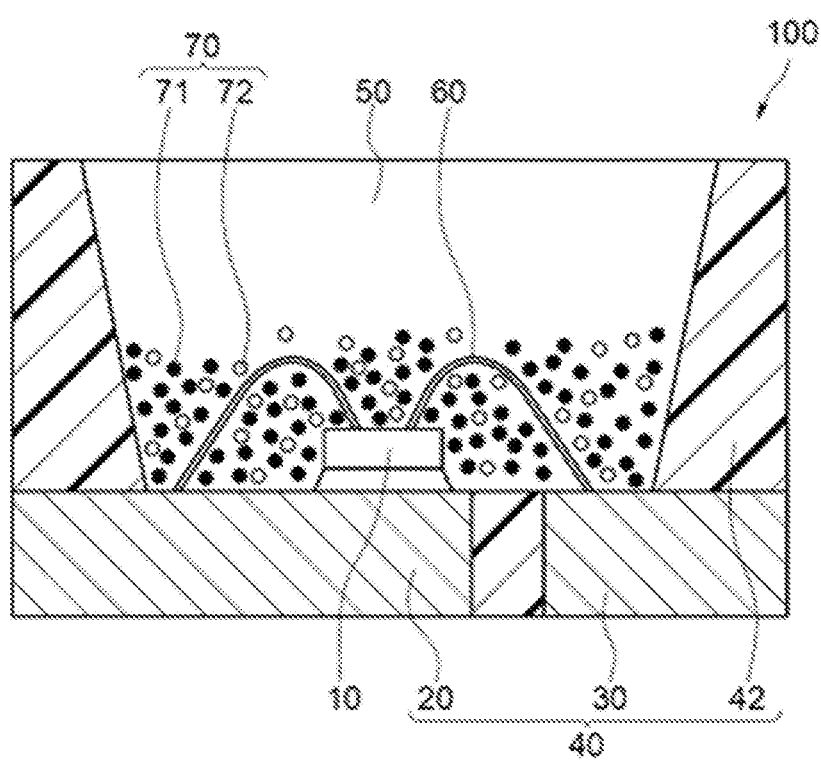
FIG. 1 is a schematic cross sectional view showing an example of a light emitting device using a fluoride fluorescent material.

The fluoride fluorescent material, the light emitting device using the same, and the method for producing a fluoride fluorescent material according to the present disclosure will be described with reference to embodiments below. However, the embodiments shown below are examples for substantiating the technical concept of the present disclosure, and the present disclosure is not limited to the fluoride fluorescent material, the light emitting device using the same, and the method for producing a fluoride fluorescent material shown below. The relationships between the color names and the color coordinates, the relationships between the wavelength ranges of light and the color names of monochromatic light, and the like are in accordance with JIS Z8110.

Fluoride Fluorescent Material

The fluoride fluorescent material has a composition containing K, Ge, $Mn^{4+}$, and F, and has a molar ratio of K of 2, a total molar ratio of Ge and $Mn^{4+}$ of 1, a molar ratio of $Mn^{4+}$ of more than 0 and less than 0.2, and a molar ratio of F of 6, in 1 mol of the composition, has a light emission spectrum having a first light emission peak in a range of 615 nm or more and less than 625 nm having a full width at half maximum of 6 nm or less, and a second light emission peak in a range of 625 nm or more and less than 635 nm, and has an internal quantum efficiency under excitation of light having a wavelength of 450 nm of 85% or more.

The fluoride fluorescent material preferably has a composition represented by the following formula (I):

$$K_2[Ge_{1-a}Mn^{4+}{}_aF_6] \quad (I)$$

wherein in the formula (I), a satisfies 0<a<0.2.

Although the mechanism of the first light emission peak in a range of 615 nm or more and less than 625 nm having a full width at half maximum of 6 nm or less in the light emission spectrum of the fluoride fluorescent material, in addition to the second light emission peak in a range of 625 nm or more and less than 635 nm, is not clear, the crystal structure thereof is different from a fluoride fluorescent material that has no first light emission peak. As the cause of the difference of the crystal structure, it is considered that the crystal structure is changed by the influence of a heat treatment. In the case where fluoride particles including a composition that contains K, Ge, $Mn^{4+}$, and F but does not contain Si are subjected to a heat treatment at a temperature of 400° C. or more, the $K_2GeF_6$ crystal structure of the fluoride particles is changed to a crystal structure similar to the $K_2MnF_6$ crystal structure. The fluoride particles having a composition which does not contain Si mean that the fluoride particles are substantially free of Si in the composition of the fluoride particle. Specifically, Si content in the composition of the fluoride particle may be 200 ppm by mass or less, 100 ppm by mass or less, or 50 ppm by mass or less with respect to 100% by mass of the fluoride particle. The light emission spectrum of the fluoride fluorescent material obtained based on the crystal structure thus changed has a first light emission peak in a range of 615 nm or more and less than 625 nm having a full width at half maximum of 6 nm or less, and a second light emission peak in a range of 625 nm or more and less than 635 nm. The light emission component due to the first light emission peak among these is added to the light emission spectrum of the fluoride fluorescent material, and thereby a higher light emission intensity than the fluoride fluorescent material containing Si in the composition thereof can be obtained.

In the case where the composition of the fluoride fluorescent material contains Ge and Si, a distorted crystal structure is formed since in Ge and Si constituting the skeleton of the crystal structure, the ionic radius of Si is considerably smaller than the ionic radius of Ge or the ionic radius of $Mn^{4+}$ as the activation element. In the case where the composition of the fluoride fluorescent material contains not only Ge but also Si, even though the light emission spectrum has a first light emission peak in a range of 615 nm or more and less than 625 nm, there may be cases where the light emission intensity at the first light emission peak is decreased as compared to the fluoride fluorescent material containing no Si in the composition thereof, thereby failing to provide a high light emission intensity as the fluoride fluorescent material.

The fluoride fluorescent material preferably has a hexagonal crystal structure and preferably has P63mc space group symmetry. The crystal structure and the space group of the fluoride fluorescent material can be quantitatively determined by the RIR (reference intensity ratio) method in the measurement by the powder X-ray diffraction (XRD) method using CuKα line.

For example, a fluoride fluorescent material that has a composition represented by $K_2[Ge_{1-a}Mn^{4+}{}_aF_6]$ (wherein a satisfies 0<a<0.2) and has no first light emission peak in a range of 615 nm or more and less than 625 nm in the light emission spectrum has a hexagonal crystal structure and has P-3 m1 space group symmetry. The difference in crystal structure between the fluoride fluorescent material that has the first light emission peak in a range of 615 nm or more and less than 625 nm in the light emission spectrum and the fluoride fluorescent material that has no first light emission peak in a range of 615 nm or more and less than 625 nm in the light emission spectrum can be confirmed from the difference in space group of the crystal phase. It is estimated that the fluoride fluorescent material having the first light emission peak in a range of 615 nm or more and less than 625 nm having a full width at half maximum of 6 nm or less, and the second light emission peak in a range of 625 nm or more and less than 635 nm, in the light emission spectrum becomes closer to the crystal structure of $K_2MnF_6$ than the crystal structure of $K_2GeF_6$ through the heat treatment at a temperature of 400° C. or more.

The fluoride fluorescent material has an internal quantum efficiency under excitation of light having a wavelength of 450 nm of 85% or more, preferably 90% or more, and more preferably 95% or more. The fluoride fluorescent material has the first light emission peak in a range of 615 nm or more and less than 625 nm having a full width at half maximum of 6 nm or less, and a second light emission peak in a range of 625 nm or more and less than 635 nm, in the light emission spectrum, and thereby has a high light emission intensity and a high internal quantum efficiency under excitation of light having a wavelength of 450 nm of 85% or more.

The fluoride fluorescent material preferably has a light emission intensity of 30% or more, more preferably 35% or more, and further preferably 37% or more at the first light emission peak in a range of 615 nm or more and less than 625 nm, based on the light emission intensity at the second light emission peak in a range of 625 nm or more and less than 635 nm as 100%. In the case where the light emission intensity at the first light emission peak is 30% or more based on the light emission intensity at the second light emission peak as 100%, the light emission intensity can be further enhanced.

The fluoride fluorescent material has a full width at half maximum of the first light emission peak in a range of 615 nm or more and less than 625 nm in the light emission spectrum of 6 nm or less, and preferably 5 nm or less. Accordingly, the fluoride fluorescent material can emit light that has a good chromatic purity and a high light emission intensity. The fluoride fluorescent material may have a full width at half maximum of the first light emission peak of 1 nm or more. The fluoride fluorescent material preferably has a full width at half maximum of the second light emission peak in a range of 625 nm or more and less than 635 nm in the light emission spectrum of 10 nm or less, and more preferably 8 nm or less. The fluoride fluorescent material may have a full width at half maximum of the second light emission peak of 1 nm or more. In the light emission spectrum of the fluoride fluorescent material, the second light emission peak in a range of 625 nm or more and less than 635 nm as the main peak may sometimes overlap a subsidiary peak around 635 nm, and in this case, it may be difficult to measure the full width at half maximum of the single light emission peak. In the light emission spectrum of the fluoride fluorescent material, even in the case where the second light emission peak in a range of 625 nm or more and less than 635 nm and the subsidiary peak partially overlap each other, the second light emission peak in a range of 625 nm or more and less than 635 nm preferably has a full width at half maximum of 10 nm or less.

Light Emitting Device

The light emitting device includes the aforementioned fluoride fluorescent material and a light source having a light emission peak in a range of 380 nm or more and 485 nm or less. The light emitting device may further include other constitutional members depending on necessity. The light emitting device includes the fluoride fluorescent material that emits light having a high light emission intensity and a good chromatic purity with a small full width at half maximum of the light emission spectrum with the light emitted from the excitation light source, and thereby can reproduce a wide range of colors in the chromaticity coordinates and can emit mixed light excellent in color reproducibility.

Light Source

The light source for exciting the fluoride fluorescent material (which may be hereinafter referred to as an "excitation light source") preferably has a light emission peak wavelength in a range of 420 nm or more and 485 nm or less, and more preferably has a light emission peak wavelength in a range of 440 nm or more and 480 nm or less, for efficiently exciting the fluoride fluorescent material to use effectively the visible light. The excitation light source used is preferably a semiconductor light emitting element (which may be hereinafter referred to as a "light emitting element"). The use of a semiconductor light emitting element such as a LED or a LD as the excitation light source may provide a light emitting device that has high efficiency, high linearity of output with respect to input, and high stability against mechanical impacts. The semiconductor light emitting element used may be, for example, a semiconductor light emitting element using a nitride semiconductor ($In_X Al_Y Ga_{1-X-Y}N$, wherein $0 \leq X$, $0 \leq Y$, $X+Y \leq 1$). The full width at half maximum of the light emission peak in the light emission spectrum of the light emitting element is preferably, for example, 30 nm or less.

Fluorescent Material

In the light emitting device, the aforementioned fluoride fluorescent material may be contained, for example, in a fluorescent member that covers the excitation light source. In the light emitting device having the excitation light source covered with the fluorescent member containing the fluoride fluorescent material, a part of the light emitted from the excitation light source is absorbed by the fluoride fluorescent material, and emitted therefrom as red light.

The light emitting device may include an additional fluorescent material other than the fluoride fluorescent material, in addition to the fluoride fluorescent material. The additional fluorescent material other than the fluoride fluorescent material suffices to be one that absorbs the light from the light source and subjects the light to wavelength conversion to light having a wavelength different from the fluoride fluorescent material. It is preferred that the light emitting device further includes a fluorescent material having a light emission peak wavelength in a range of 495 nm or more and 573 nm or less.

The additional fluorescent material other than the fluoride fluorescent material is preferably, for example, at least one kind selected from the group consisting of a rare earth aluminate fluorescent material, a halogen silicate fluorescent material, an alkaline earth aluminate fluorescent material, a β-SiAlON fluorescent material, an alkaline earth metal silicate fluorescent material, and an alkaline earth sulfide fluorescent material, which are activated mainly with a lanthanoid element, such as Ce, an alkaline earth metal halophosphate fluorescent material and a germanate salt fluorescent material, which are activated mainly with a lanthanoid element, such as Eu, or a transition metal element, such as Mn, a nitride fluorescent material, an oxynitride fluorescent material, an alkaline earth metal borohalide fluorescent material, an alkaline earth metal aluminate fluorescent material, an alkaline earth silicon nitride fluorescent material and a rare earth silicate fluorescent material, which are activated mainly with a lanthanoid element, such as Eu and Ce, and an organic or organic complex fluorescent material, which is activated mainly with a lanthanoid element, such as Eu.

Examples of the fluorescent material having a light emission peak wavelength in a range of 495 nm or more and 573 nm or less by irradiation with an excitation light source having a light emission peak wavelength in a range of 380 nm or more and 485 nm or less include $(Lu,Y,Gd,Lu)_3(Ga,Al)_5O_{12}$:Ce, $(Ca, Sr, Ba)_8MgSi_4O_{16}(F, Cl,Br)_2$:Eu, $Si_{6-z}Al_zO_zN_{8-z}$:Eu ($0<z\leq4.2$), and $(Ca,Sr,Ba)_2SiO_4$:Eu. In the formulae showing the compositions of the fluorescent materials, the plural elements delimited by a comma (,) means that at least one kind of the plural elements is contained in the composition. In the description herein, in the formulae showing the compositions of the fluorescent materials, the term before the colon (:) shows the elements constituting the base crystal and the molar ratios thereof, and the term after the colon (:) shows the activation element.

An example of the light emitting device will be described with reference to the drawing. FIG. 1 is a schematic cross sectional view showing an example of the light emitting device. The light emitting device is an example of a surface mounted light emitting device.

The light emitting device 100 has a light emitting element 10 that emits light having a light emission peak wavelength on the short wavelength side of the visible light, for example, in a range of 380 nm or more and 485 nm or less, and a molded body 40 having the light emitting element 10 disposed thereon. The molded body 40 has a first lead 20 and a second lead 30, which are integrally molded with a thermoplastic resin or a thermosetting resin. The molded body 40 has a concave portion having a bottom surface and a side surface, and the light emitting element 10 is disposed on the bottom surface of the concave portion. The light emitting element 10 has one pair of positive and negative electrodes, and the one pair of positive and negative electrodes are electrically connected to the first lead 20 and the second lead 30 respectively with wires 60. The light emitting element 10 is sealed with a fluorescent member 50. The fluorescent member 50 contains a fluorescent material 70 containing a fluoride fluorescent material performing wavelength conversion of the light emitted from the light emitting element 10. The fluorescent material 70 contains the fluoride fluorescent material as a first fluorescent material 71, and may contain a second fluorescent material 72 that emits light having a light emission peak wavelength in a wavelength range different from the fluoride fluorescent material with the excitation light from the light emitting element 10.

The fluorescent member may contain a resin and the fluorescent material, and examples of the resin include a silicone resin and an epoxy resin. The fluorescent member may further contain a light diffusion material, such as silica, titanium oxide, zinc oxide, zirconium oxide, and alumina, in addition to the resin and the fluorescent material. The light diffusing material contained may reduce the directionality from the light emitting element to enhance the viewing angle.

Method for Producing Fluoride Fluorescent Material

The method for producing a fluoride fluorescent material, includes: preparing fluoride particles including a composition including K, Ge, $Mn^{4+}$, and F, and having a molar ratio of K of 2, a total molar ratio of Ge and $Mn^{4+}$ of 1, a molar ratio of $Mn^{4+}$ of more than 0 and less than 0.2, and a molar ratio of F of 6 in 1 mol of the composition; and bringing the fluoride particles into contact with a fluorine-containing substance, and subjecting to a heat treatment at a temperature of 400° C. or more. The fluoride particles are brought into contact with the fluorine-containing substance and are subjected to a heat treatment at a temperature of 400° C. or more, the amount (molar ratio) of fluorine in the fluoride particles it self does not change, but the crystal structure thereof changes. Specifically, the crystal structure of the fluoride particles changes from the crystal structure of $K_2GeF_6$ to the structure close to the crystal structure of $K_2MnF_6$.

The fluoride particles preferably have a composition represented by the following formula (I):

$$K_2[Ge_{1-a}Mn^{4+}{}_aF_6] \qquad (I)$$

wherein in the formula (I), a satisfies 0<a<0.2.

The fluoride particles are brought into contact with a fluorine-containing substance and subjected to a heat treatment at a temperature of 400° C. or more, and thereby a fluoride fluorescent material having a crystal structure having been changed from the $K_2GeF_6$ crystal structure to a crystal structure similar to the $K_2MnF_6$ crystal structure is obtained. The fluoride fluorescent material has a light emission spectrum having a first light emission peak in a range of 615 nm or more and less than 625 nm having a full width at half maximum of 6 nm or less, and a second light emission peak in a range of 625 nm or more and less than 635 nm, and thus the first light emission peak has a small full width at half maximum. Accordingly, a good chromatic purity is obtained, and a higher light emission intensity is obtained due to the first light emission peak and the second light emission peak.

Method for Producing Fluoride Particles

The fluoride particles may be produced, for example, by a production method including a step of mixing a first solution containing at least potassium ion and hydrogen fluoride, a second solution containing at least a first complex ion including tetravalent manganese and hydrogen fluoride, and a third solution containing at least a second complex ion including germanium and fluoride ion. The first solution, the second solution, and the third solution are mixed, and thereby fluoride particles that have a target composition and function as a fluorescent material can be produced by a simple method excellent in productivity.

First Solution

The first solution (which may be hereinafter referred to as a "solution A") contains at least potassium ion and hydrogen fluoride, and may further contain additional components depending on necessity. The first solution may be, for example, an aqueous solution of hydrofluoric acid containing potassium ion. The first solution may be obtained by dissolving a compound containing potassium in an aqueous solution of hydrofluoric acid. Examples of the compound containing potassium used in the first solution include a water soluble compound, such as a halide, a hydrofluoride, a hydroxide, an acetate, and a carbonate. Specific examples thereof include water soluble potassium salts, such as KF, $KHF_2$, KOH, KCl, KBr, KI, potassium acetate, and $K_2CO_3$. Among these, $KHF_2$ is preferred since this compound may be dissolved in the solution without decrease of the hydrogen fluoride concentration thereof and has a small heat of dissolution and high safety. The compound containing potassium constituting the first solution may be used alone or as a combination of two or more kinds thereof.

The hydrogen fluoride concentration in the first solution is generally 1% by mass or more, preferably 3% by mass or more, and more preferably 5% by mass or more. The hydrogen fluoride concentration in the first solution is generally 80% by mass or less, preferably 75% by mass or less, and more preferably 70% by mass or less.

The potassium ion concentration in the first solution is generally 1% by mass or more, preferably 3% by mass or more, and more preferably 5% by mass or more. The potassium ion concentration in the first solution is generally 30% by mass or less, preferably 25% by mass or less, and more preferably 20% by mass or less. In the case where the potassium ion concentration is 5% by mass or more, there may be a tendency that the yield of the fluoride particles is increased.

Second Solution

The second solution (which may be hereinafter referred to as a "solution B") contains a first complex ion including tetravalent manganese and hydrogen fluoride, and may further contain additional components depending on necessity. The second solution may be, for example, an aqueous solution of hydrofluoric acid in which a tetravalent manganese source is dissolved. The manganese source is a compound containing tetravalent manganese. Specific examples of the manganese source contained in the second solution include $K_2MnF_6$, $KMnO_4$, and $K_2MnCl_6$. Among these, $K_2MnF_6$ is preferred since this compound does not contain chlorine, which tends to destabilize the crystal lattice through distortion, and can stably exist in hydrofluoric acid as $MnF_6$ complex ion while retaining the oxidation number (tetravalent) capable of performing the activation. A manganese source containing potassium may also function as the source of potassium contained in the first solution. The manganese source constituting the second solution may be used alone or as a combination of two or more kinds thereof.

The hydrogen fluoride concentration in the second solution is generally 1% by mass or more, preferably 3% by mass or more, and more preferably 5% by mass or more. The hydrogen fluoride concentration in the second solution is generally 80% by mass or less, preferably 75% by mass or less, and more preferably 70% by mass or less.

The first complex ion concentration in the second solution is generally 0.01% by mass or more, preferably 0.03% by mass or more, and more preferably 0.05% by mass or more. The first complex ion concentration in the second solution is generally 5% by mass or less, preferably 4% by mass or less, and more preferably 3% by mass or less.

Third Solution

The third solution (which may be hereinafter referred to as a "solution C") contains a second complex ion including germanium and fluoride ion, and may further contain additional components depending on necessity. The third solution may be, for example, an aqueous solution in which a second complex ion source is dissolved.

The second complex ion source is preferably a compound that contains germanium and fluoride ion and is excellent in solubility in the solution. Specific examples of the second complex ion source include $H_2GeF_6$, $Na_2GeF_6$, $(NH_4)_2GeF_6$, $Rb_2GeF_6$, and $Cs_2GeF_6$. Among these, $H_2GeF_6$ is preferred since this compound has high solubility in water and does not contain an alkali metal element as an impurity. The second complex ion source constituting the third solution may be used alone or as a combination of two or more kinds thereof.

The second complex ion concentration in the third solution is generally 10% by mass or more, preferably 15% by mass or more, and more preferably 20% by mass or more. The second complex ion concentration in the third solution is generally 60% by mass or less, preferably 55% by mass or less, and more preferably 50% by mass or less.

As the mixing method of the first solution, the second solution, and the third solution, for example, the second solution and the third solution may be added and mixed into the first solution under stirring, or the first solution and the second solution may be added and mixed into the third solution under stirring. Alternatively, the first solution, the second solution, and the third solution each may be placed in a vessel and then mixed by stirring.

By mixing the first solution, the second solution, and the third solution, the first complex ion, potassium ion, and the second complex ion are reacted with each other to deposit the target fluoride particles. The deposited crystals may be recovered through solid-liquid separation by filtration. The crystals may be rinsed with a solvent, such as ethanol, isopropyl alcohol, water, and acetone. The crystals may be subjected to a drying treatment, and may be dried at generally 50° C. or more, preferably 55° C. or more, and more preferably 60° C. or more, and may be dried at generally 110° C. or less, preferably 105° C. or less, and more preferably 100° C. or less. The drying time may just be time which can evaporated water attached to the fluoride particles. The drying time is preferably in a range of 3 hours or more and 20 hours or less, more preferably in a range of 5 hours or more and 15 hours or less. The drying time may be, for example, approximately 10 hours.

In mixing the first solution, the second solution, and the third solution, the mixing ratio of the first solution, the second solution, and the third solution is preferably appropriately controlled to provide the fluoride particles as a product having the target composition, in consideration of the discrepancy between the composition during preparation of the aforementioned raw materials of the fluorescent material and the composition of the resulting fluoride particles.

Rinsing

The resulting fluoride particles may be rinsed with a rinsing liquid for removing impurities. Examples of the rinsing liquid include ethanol, isopropyl alcohol, water, and acetone. Among these, water having high solubility to fluoride salts, such as potassium fluoride, is preferably used. The water used is preferably deionized water. The rinsing liquid may contain a reducing agent, such as hydrogen peroxide. In the case where the rinsing liquid contains a reducing agent, even though manganese as an activating agent in the fluoride particles is oxidized by the heat treatment, the oxidized manganese is reduced with the reducing agent in the rinsing liquid, so as to enhance the light emission characteristics of the resulting fluoride fluorescent material. The fluoride fluorescent material after rinsing may be further subjected to a drying treatment, and the drying temperature in the drying treatment is generally 50° C. or more, preferably 55° C. or more, and more preferably 60° C. or more, and is generally 110° C. or less, preferably 105° C. or less, and more preferably 100° C. or less. The drying time may just be time which can evaporated water attached to the fluoride fluorescent material. The drying time is preferably in a range of 3 hours or more and 20 hours or less, more preferably in a range of 5 hours or more and 15 hours or less. The drying time may be, for example, approximately 10 hours.

Heat Treatment of Fluoride Particles

The fluoride particles are brought into contact with a fluorine-containing substance and subjected to a heat treatment at a temperature of 400° C. or more, and thereby the crystal structure around $Mn^{4+}$ as the activation element in the fluoride particles is stabilized, so as to provide the fluoride fluorescent material, in which the crystal structure having a composition shown by $K_2GeF_6$ of the fluoride particles has been changed to a crystal structure similar to the crystal structure having a composition shown by $K_2MnF_6$. The fluoride particles are changed to a stable crystal structure by bringing into contact with a fluorine-containing substance and subjecting to a heat treatment at a temperature of 400° C. or more. The light emission spectrum of the fluoride fluorescent material obtained through the heat treatment has a first light emission peak in a range of 615 nm or more and less than 625 nm having a full width at half maximum of 6 nm or less, and a second light emission peak in a range of 625 nm or more and less than 635 nm. The resulting fluoride fluorescent material preferably has an internal quantum efficiency under excitation of light having a wavelength of 450 nm of 85% or more. The resulting fluoride fluorescent material preferably has a composition represented by the aforementioned formula (I).

The resulting fluoride fluorescent material preferably has a light emission intensity of 30% or more at the first light emission peak in a range of 615 nm or more and less than 625 nm based on the light emission intensity at the second light emission peak in a range of 625 nm or more and less than 635 nm as 100%. For example, in the case where the fluoride particles contain K, Ge, Si, $Mn^{4+}$, and F in the composition thereof, a distorted crystal structure is formed since in Ge and Si constituting the skeleton of the crystal structure, the ionic radius of Si is considerably smaller than the ionic radius of Ge or the ionic radius of $Mn^{4+}$ as the activation element. Furthermore, in the case where the fluoride particles contain K, Ge, Si, $Mn^{4+}$, and F in the composition thereof, even though the fluoride particles have a crystal structure similar to the $K_2MnF_6$ crystal structure, the crystal structure is changed to a crystal structure similar to the $K_2SiF_6$ crystal structure by the heat treatment at a temperature of 400° C. or more, and the resulting fluoride fluorescent material has a light emission spectrum, in which the first light emission peak in a range of 615 nm or more and less than 625 nm has a lowered light emission intensity.

The temperature of the heat treatment of the fluoride particles is preferably a temperature exceeding 400° C., more preferably 425° C. or more, and further preferably 450° C. or more. In the case where the temperature of the heat treatment of the fluoride particles is less than 400° C., the fluoride particles undergo small change of the crystal structure, and it is difficult to achieve a higher light emission intensity. In the case where the temperature of the heat treatment of the fluoride particles is too high, the fluoride particles may be decomposed in some cases. Accordingly, the temperature of the heat treatment of the fluoride particles is preferably 600° C. or less, and more preferably in a range of 450° C. or more and 550° C. or less.

The heat treatment of the fluoride particles is preferably performed in an inert gas atmosphere. The inert gas atmosphere herein means an atmosphere containing argon, helium, nitrogen as a major component in the atmosphere. The major component in the atmosphere means that at least one kind of gas selected from argon, helium, and nitrogen has a gas concentration of 70% by volume or more in the atmosphere. The inert gas atmosphere preferably contains nitrogen. The nitrogen gas concentration in the inert gas atmosphere is preferably 70% by volume or more, more preferably 80% by volume or more, further preferably 85% by volume or more, and still further preferably 90% by volume or more. The inert gas atmosphere may contain oxygen as an unavoidable impurity. Herein, an atmosphere that has a concentration of oxygen contained in the atmosphere of 15% by volume or less may be designated as the inert gas atmosphere. The concentration of oxygen in the inert gas atmosphere is preferably 0.3% by volume or less, and more preferably 0.1% by volume or less, and it is further preferred that no oxygen is contained in the atmosphere. In the case where the oxygen concentration in the inert gas atmosphere in the heat treatment of the fluoride particles is the prescribed value or more, $Mn^{4+}$ as the activation element in the fluoride particles may be oxidized to lower the light emission intensity of the fluoride fluorescent material.

The fluorine-containing substance is preferably at least one kind selected from the group consisting of $F_2$, $CHF_3$, $CF_4$, $NH_4HF_2$, $NH_4F$, $SiF_4$, and $NF_3$ since these compounds can be readily brought into contact with the fluoride particles. The fluorine-containing substance is more preferably $F_2$ or $NH_4F$.

The temperature of the environment, in which the fluoride particles are brought into contact with the fluorine-containing substance in a solid state or a liquid state, may be from room temperature (20° C.±5° C.) to a temperature lower than the heat treatment temperature, and may be the heat treatment temperature. Specifically, the temperature may be a low temperature of 20° C. or more and less than 400° C., and may be the heat treatment temperature of 400° C. or more. In the case where the temperature of the environment, in which the fluoride particles are brought into contact with the fluoride-containing substance in a solid state at ordinary temperature, is 20° C. or more and less than 400° C., the fluoride particles are brought into contact with the fluorine-containing substance and then subjected to the heat treatment at 400° C. or more.

In the case where the fluorine-containing substance is in a solid state or a liquid state at ordinary temperature, it is preferred that the fluorine-containing substance in an amount of 1% by mass or more and 20% by mass or less in terms of fluorine element amount based on the total amount of the fluoride particles and the fluorine-containing substance as 100% by mass is brought into contact with the fluoride particles. The fluoride particles are brought into contact with the fluorine-containing substance, and thereby the fluoride fluorescent material having a high light emission intensity can be provided.

In the case where the fluorine-containing substance is a gas, or a gas containing fluorine generated from a fluorine-containing substance in a solid state or a liquid state, the fluoride particles may be brought into contact therewith by disposing the fluoride particles in an inert gas atmosphere containing the fluorine-containing substance. It is also possible that the fluoride particles are disposed in an inert gas atmosphere containing the fluorine-containing substance, and then the fluoride particles are subjected to the heat treatment at a temperature of 400° C. or more in the inert gas atmosphere containing the fluorine-containing substance. In the case where the fluorine-containing substance is $F_2$ (fluorine gas), and the fluoride particles are subjected to the heat treatment at a temperature of 400° C. or more in an inert gas atmosphere containing $F_2$, the $F_2$ concentration of the inert gas atmosphere is preferably 3% by volume or more, and more preferably 5% by volume or more, and is preferably 30% by volume or less, and more preferably 25% by volume or less. In the case where the concentration of fluorine gas in the inert gas atmosphere is 3% by volume or more and 30% by volume or less, the portion of the fluoride particles deficient in fluorine as a result of the heat treatment is compensated with fluorine, so as to stabilize the crystal structure, and thereby the fluoride fluorescent material having a high light emission intensity can be obtained.

The retention time in the heat treatment of the fluoride particles means a period of time where the fluoride particles are subjected to the heat treatment at the temperature of the heat treatment. The retention time in the heat treatment is preferably in a range of 2 hours or more and 20 hours or less, and more preferably in a range of 4 hours or more and 15 hours or less. In the case where the retention time of the heat treatment at a temperature of 400° C. or more is in a range of 2 hours or more and 20 hours or less, the crystal structure is stabilized, and thereby the fluoride fluorescent material having a high light emission intensity can be obtained.

The pressure in the heat treatment may be the atmospheric pressure (0.101 MPa) or a pressurized atmosphere of more than 0.101 MPa and 1 MPa or less.

EXAMPLES

The present disclosure will be described more specifically with reference to examples below. The present disclosure is not limited to the examples.

Example 1

Production of Fluoride Particles

The production method of fluoride particles will be described. 1,483.7 g of $KHF_2$ was weighed, and the $KHF_2$ was dissolved in 5.0 L of an 11% by mass HF aqueous solution, so as to prepare a solution A (first solution). 123.56 g of $K_2MnF_6$ was weighed, and the $K_2MnF_6$ was dissolved in 5.0 L of a 55% by mass HF aqueous solution, and 5.0 L of deionized water was added thereto, so as to prepare a solution B (second solution). 993.56 g of $GeO_2$ was weighed, and the $GeO_2$ was dissolved in a 55% by mass HF aqueous solution to prepare 4,480 g of an aqueous solution containing 40% by mass of $H_2GeF_6$, which was designated as a solution C (third solution).

Subsequently, the solution A was stirred at room temperature, to which the solution B and the solution C each were added dropwise over approximately 10 minutes to provide a precipitate.

The resulting precipitate was subjected to solid-liquid separation and then ethanol rinsing, and was dried at 90° C. for 10 hours to produce fluoride particles.

Heat Treatment of Fluoride Particles

The resulting fluoride particles were subjected to a heat treatment in an atmosphere containing fluorine gas ($F_2$) and nitrogen gas ($N_2$) as an inert gas, having a fluorine gas concentration of 20% by volume and a nitrogen gas concentration of 80% by volume, at a temperature of 450° C. for a retention time of 8 hours, and thereby a fluoride fluorescent material of Example 1 having a composition represented by $K_2[Ge_{0.95}Mn^{4+}_{0.05}F_6]$ was obtained.

Example 2

A fluoride fluorescent material of Example 2 having a composition represented by $K_2[Ge_{0.95}Mn^{4+}_{0.05}F_6]$ was obtained in the same manner as in Example 1 except that the heat treatment temperature was changed to 500° C.

Example 3

A fluoride fluorescent material of Example 3 having a composition represented by $K_2[Ge_{0.95}Mn^{4+}_{0.05}F_6]$ was obtained in the same manner as in Example 1 except that the heat treatment temperature was changed to 550° C.

Example 4

A fluoride fluorescent material of Example 4 having a composition represented by $K_2[Ge_{0.95}Mn^{4+}_{0.05}F_6]$ was obtained in the same manner as in Example 1 except that the heat treatment temperature was changed to 400° C.

Comparative Example 1

The fluoride particles produced in Example 1 were designated as a fluoride fluorescent material of Comparative Example 1 having a composition represented by $K_2[Ge_{0.95}Mn^{4+}_{0.05}F_6]$ without a heat treatment.

Comparative Example 2

A fluoride fluorescent material of Comparative Example 2 having a composition represented by $K_2[Ge_{0.95}Mn^{4+}_{0.05}F_6]$ was obtained in the same manner as in Example 1 except that the heat treatment temperature was changed to 300° C.

Comparative Example 3

A fluoride fluorescent material of Comparative Example 3 having a composition represented by $K_2[Ge_{0.95}Mn^{4+}_{0.05}F_6]$ was obtained in the same manner as in Example 1 except that the heat treatment temperature was changed to 150° C.

Comparative Example 4

A fluoride fluorescent material of Comparative Example 4 having a composition represented by $K_2[Ge_{0.95}Mn^{4+}_{0.05}F_6]$ was obtained in the same manner as in Example 1 except that the heat treatment temperature was changed to 500° C., and the fluoride particles were subjected to the heat treatment in an inert gas atmosphere having a nitrogen gas concentration of 100% by volume without contact with a fluorine-containing substance.

Comparative Example 5

478.9 g of $KHF_2$ was weighed, and the $KHF_2$ was dissolved in 5.0 L of a 55% by mass HF aqueous solution, so as to prepare a solution A (first solution). 65.9 g of $K_2MnF_6$ was weighed, and the $K_2MnF_6$ was dissolved in 1.8 L of a 55% by mass HF aqueous solution, so as to prepare a solution B (second solution). 224.5 g of $GeO_2$ was weighed, and the $GeO_2$ was dissolved in a 55% by mass HF aqueous solution, and 1,012 g of an aqueous solution containing 40% by mass of $H_2GeF_6$ and 331 g of a 40% by mass $H_2SiF_6$ aqueous solution were mixed, so as to prepare a solution C (third solution).

Subsequently, the solution A was stirred at room temperature, to which the solution B and the solution C each were added dropwise over approximately 10 minutes to provide a precipitate. The resulting precipitate was subjected to solid-liquid separation and then ethanol rinsing, and was dried at 90° C. for 10 hours to produce fluoride particles. The resulting fluoride particles were designated as a fluoride fluorescent material of Comparative Example 5 having a composition represented by $K_2[Si_{0.54}Ge_{0.41}Mn^{4+}_{0.05}F_6]$ without subjecting to a heat treatment.

Comparative Example 6

The fluoride particles obtained in Comparative Example 5 were subjected to a heat treatment in an atmosphere containing fluorine gas ($F_2$) and nitrogen gas ($N_2$) as an inert gas, having a fluorine gas concentration of 20% by volume and a nitrogen gas concentration of 80% by volume, at a temperature of 450° C. for a retention time of 8 hours, and thereby a fluoride fluorescent material of Comparative Example 6 having a composition represented by $K_2[Si_{0.54}Ge_{0.41}Mn^{4+}_{0.05}F_6]$ was obtained.

Reference Example 1

As Reference Example 1, a fluoride fluorescent material having a composition represented by $K_2SiF_6:Mn^{4+}$ was prepared.

Reference Example 2

The fluoride fluorescent material of Reference Example 1 having a composition represented by $K_2SiF_6:Mn^{4+}$ was subjected to a heat treatment under the same condition as in Example 1, so as to provide a fluoride fluorescent material of Reference Example 2.

Evaluation

Light Emission Spectrum

Figure 2:
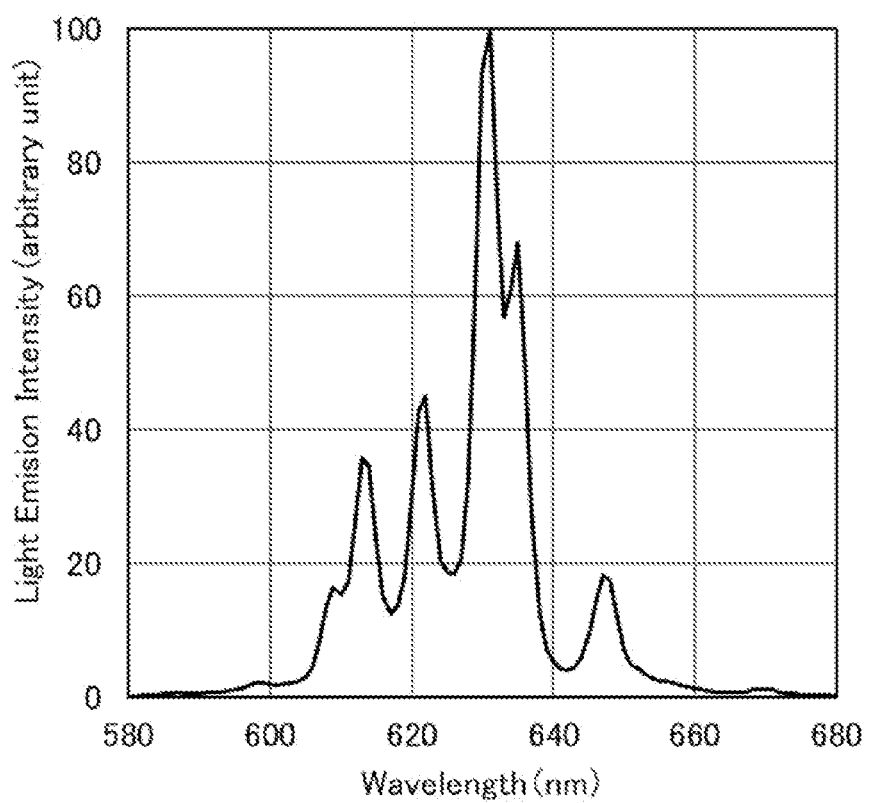
FIG. 2 is a light emission spectrum of the fluoride fluorescent material of Example 1 of the present disclosure.
Figure 3:
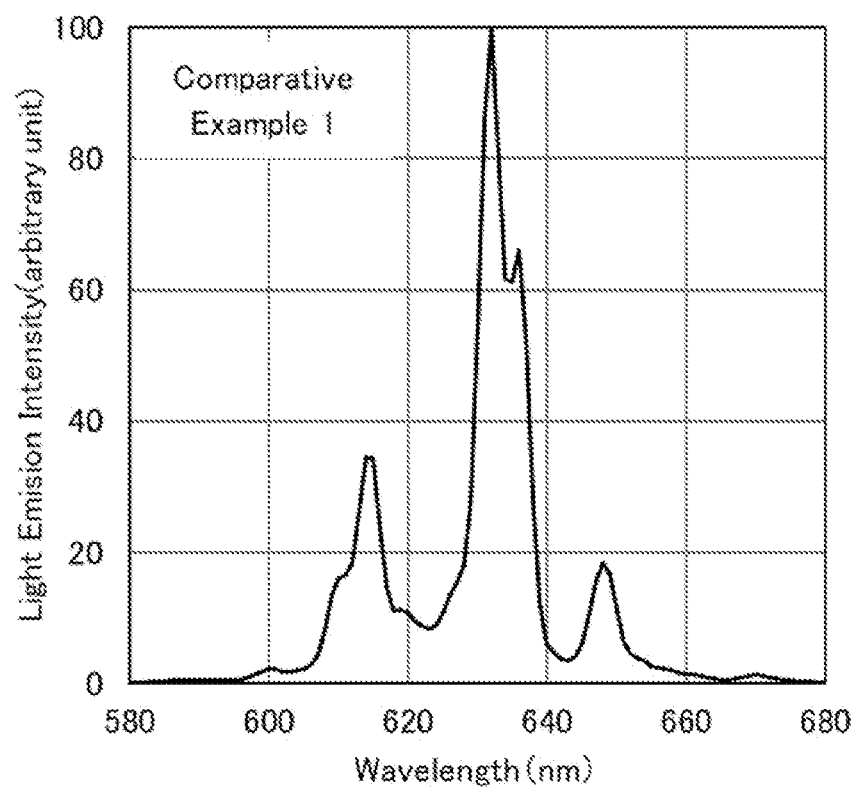
FIG. 3 is a light emission spectrum of the fluoride fluorescent material of Comparative Example 1 of the present disclosure.
Figure 6:
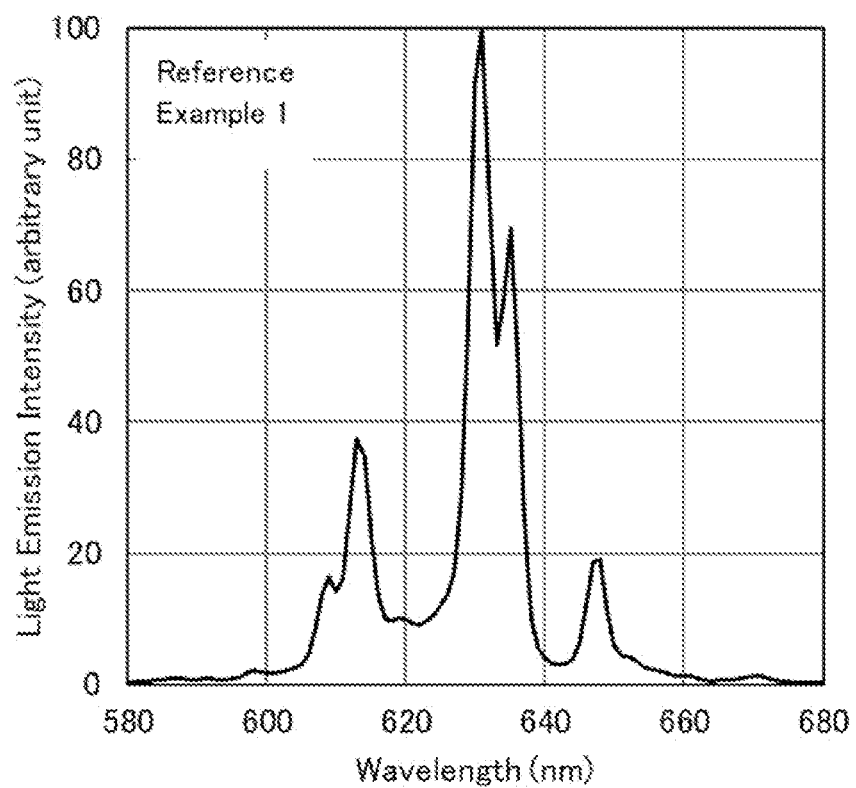
FIG. 6 is the light emission spectrum of the fluoride fluorescent material of Reference Example 1.
Figure 7:
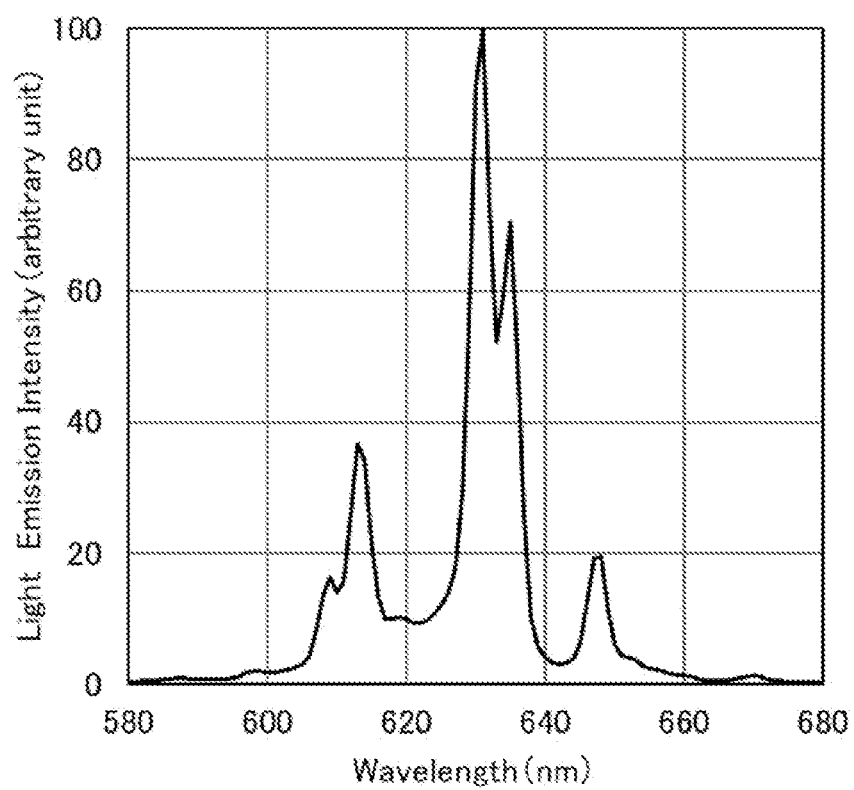
FIG. 7 is a light emission spectrum of the fluoride fluorescent material of Reference Example 2.

The resulting fluoride fluorescent materials of Examples and Comparative Examples each were irradiated with excitation light having a light emission peak wavelength of 450 nm with a Quantum Efficiency Measurement System (QE-2000, manufactured by Otsuka Electronics Co., Ltd.), and the light emission spectra of the fluoride fluorescent materials at room temperature were measured. FIG. 2 shows the light emission spectrum of the fluoride fluorescent material of Example 1. FIG. 3 shows the light emission spectrum of the fluoride fluorescent material of Comparative Example 1. FIG. 6 shows the light emission spectrum of the fluoride fluorescent material of Reference Example 1 having a composition represented by $K_2SiF_6:Mn^{4+}$. FIG. 7 shows the light emission spectrum of the fluoride fluorescent material of Reference Example 2 having a composition represented by $K_2SiF_6:Mn^{4+}$.

Chromaticities x,y

From the data of each of the light emission spectra measured for the fluoride fluorescent materials of Examples and Comparative Examples, the chromaticity x and the chromaticity y in the xy chromaticity coordinates in the CIE (Commission International de l'eclarirage) 1931 color coordinate system were obtained. The results are shown in Table 1.

Relative Light Emission Intensity

From the data of each of the light emission spectra measured for the fluoride fluorescent materials of Examples and Comparative Examples, the maximum light emission intensity of each of the fluoride fluorescent materials of Examples 1 to 4 and Comparative Examples 2 to 6 was obtained as a relative light emission intensity with respect to the maximum light emission intensity in the light emission spectrum of the fluoride fluorescent material of Comparative Example 1 as 100%. The results are shown in Table 1.

Full Width at Half Maximum

From the data of each of the light emission spectra measured for the fluoride fluorescent materials of Examples and Comparative Examples, the full width at half maximum of the first light emission peak in a range of 615 nm or more and less than 625 nm was obtained. The results are shown in Table 1.

Light Emission Peak Intensity Ratio

From the data of each of the light emission spectra measured for the fluoride fluorescent materials of Examples and Comparative Examples, the light emission peak intensity ratio of the first light emission peak in a range of 615 nm or more and less than 625 nm with respect to the light emission intensity at the second light emission peak in a range of 625 nm or more and less than 635 nm as 100% was obtained. The results are shown in Table 1.

X-ray Diffraction Pattern

Figure 4:
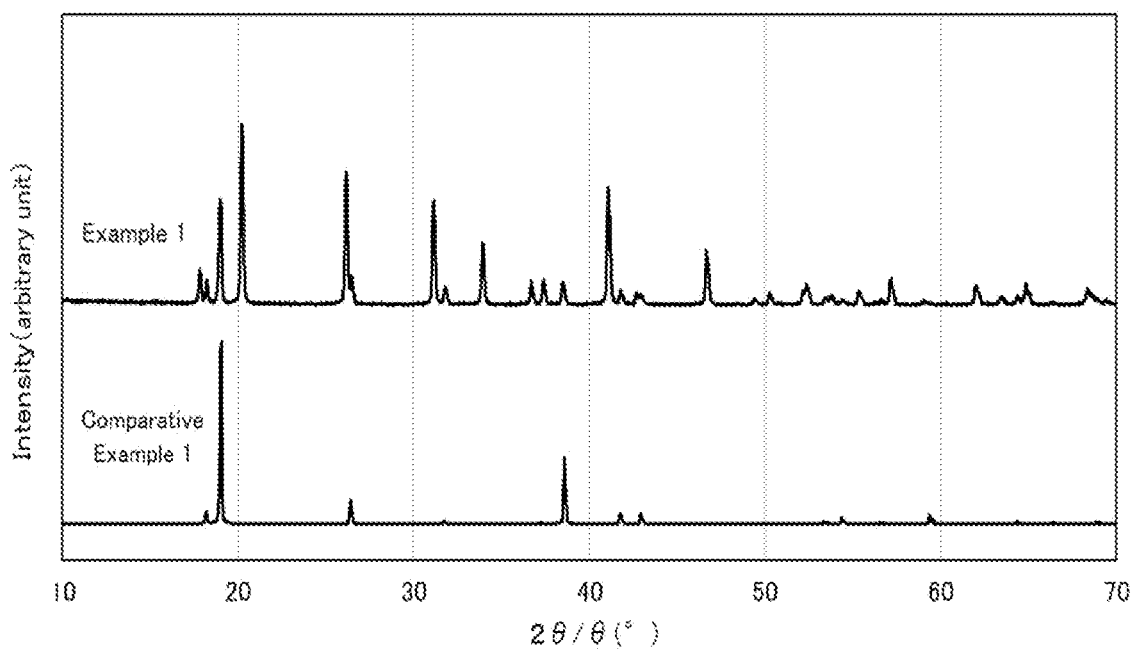
FIG. 4 shows X-ray diffraction patterns of the fluoride fluorescent materials of Example 1 and Comparative Example 1 of the present disclosure.
Figure 5:
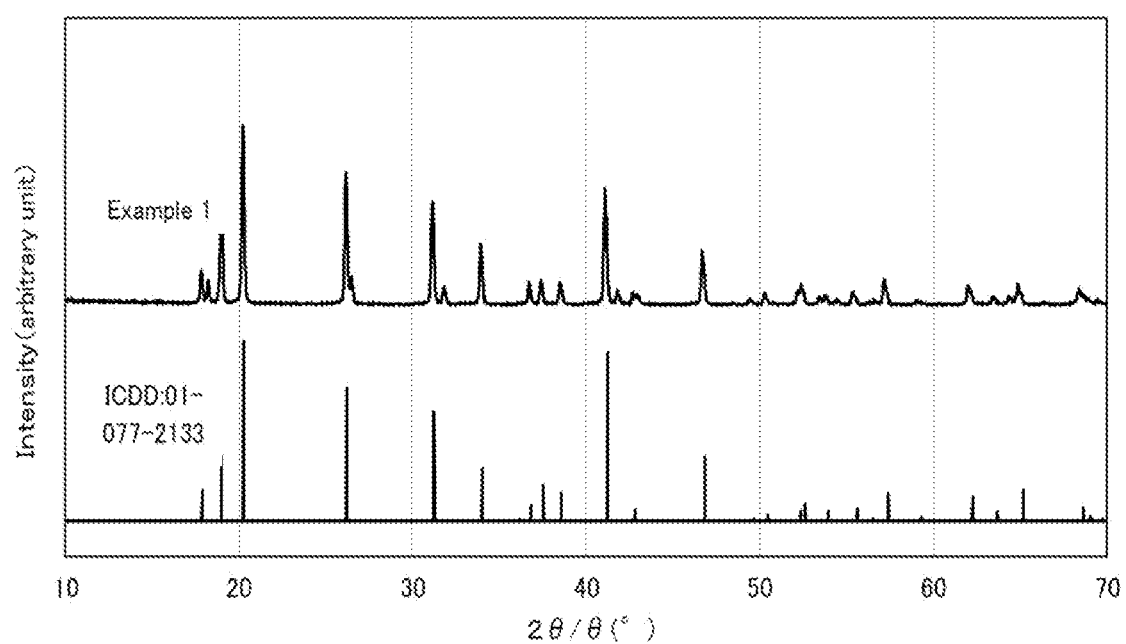
FIG. 5 shows an X-ray diffraction pattern of the fluoride fluorescent material of Example 1 of the present disclosure and an X-ray diffraction pattern of the crystal structure model of $K_2MnF_6$ according to ICDD Card No. 01-077-2133.
Figure 8:
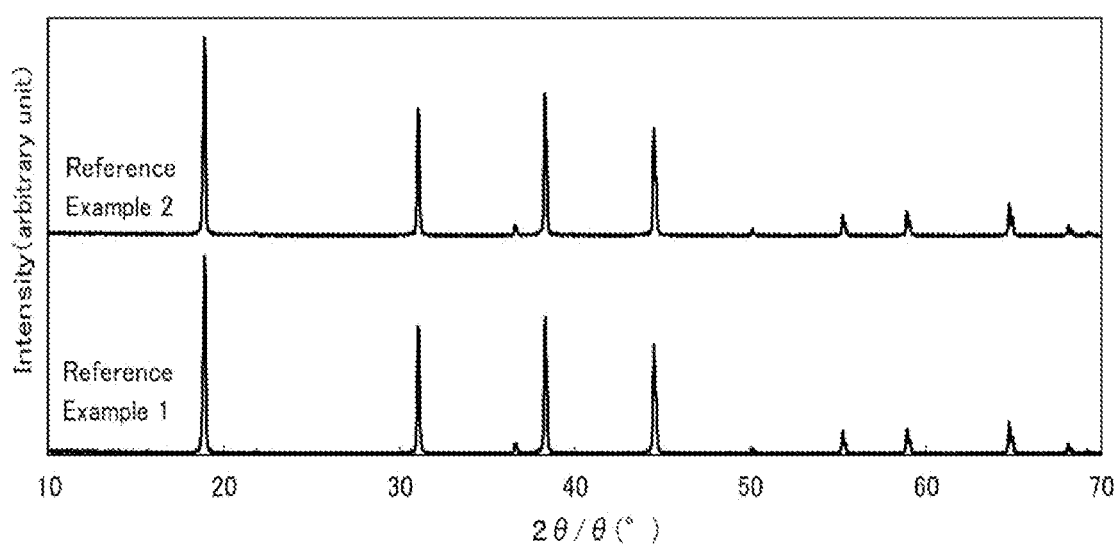
FIG. 8 shows X-ray diffraction patterns of the fluoride fluorescent materials of Reference Example 1 and Reference Example 2.

X-ray diffraction patterns of the fluoride fluorescent materials of Example 1 and Comparative Example 1 each were measured with a horizontal sample multipurpose X-ray diffraction system (Ultima IV, manufactured by Rigaku Corporation, X-ray source: CuKα line (λ=1.5418 Å, tube voltage: 40 kV tube current: 40 mA)). FIG. 4 shows X-ray diffraction patterns of the fluoride fluorescent materials of Example 1 and Comparative Example 1. FIG. 5 shows an X-ray diffraction pattern of the fluoride fluorescent material of Example 1 and an X-ray diffraction pattern of the crystal structure model of $K_2MnF_6$ according to ICDD Card No. 01-077-2133 using the ICDD (International Center for Diffraction Data) database. FIG. 8 shows X-ray diffraction patterns of the fluoride fluorescent materials of Reference Example 1 and Reference Example 2 each having a composition represented by $K_2SiF_6:Mn^{4+}$.

TABLE 1

| | Heat treatment condition | | Chromaticity | | Light emission characteristics | | | |
|---|---|---|---|---|---|---|---|---|
| | Temperature (° C.) | Atmosphere | x | y | Relative light emission intensity (%) | Full width at half maximum of first light emission peak (nm) | Internal quantum efficiency (%) | Light emission peak intensity ratio (%) |
| Example 1 | 450 | $F_2/N_2$ | 0.694 | 0.306 | 132.9 | 4.4 | 98.5 | 45 |
| Example 2 | 500 | $F_2/N_2$ | 0.694 | 0.306 | 125.5 | 4.7 | 97.4 | 37 |
| Example 3 | 550 | $F_2/N_2$ | 0.694 | 0.306 | 131.0 | 4.4 | 98.6 | 43 |
| Example 4 | 400 | $F_2/N_2$ | 0.693 | 0.307 | 114.7 | 4.4 | 86.0 | 44 |
| Comparative Example 1 | — | — | 0.694 | 0.305 | 100.0 | — | 81.6 | 11 |
| Comparative Example 2 | 300 | $F_2/N_2$ | 0.693 | 0.307 | 76.4 | 4.5 | 56.2 | 39 |
| Comparative Example 3 | 150 | $F_2/N_2$ | 0.695 | 0.305 | 98.1 | — | 77.8 | 11 |
| Comparative Example 4 | 500 | $N_2$ | 0.691 | 0.308 | 48.9 | 4.3 | 35.9 | 48 |
| Comparative Example 5 | — | — | 0.693 | 0.307 | 103.5 | 4.4 | 84.8 | 47 |
| Comparative Example 6 | 450 | $F_2/N_2$ | 0.693 | 0.306 | 106.8 | — | 83.8 | 24 |

Internal Quantum Efficiency

From the data of each of the light emission spectra measured for the fluoride fluorescent materials of Examples and Comparative Examples, the internal quantum efficiency (%) under excitation of light having a wavelength of 450 nm was obtained. The results are shown in Table 1. The light emission spectra data of each of the fluorescent material of Examples and Comparative Examples ware measured at room temperature using Quantum Efficiency Measurement System (QE-2000, manufactured by Otsuka Electronics Co., Ltd.). The internal quantum efficiency is obtained by the following equation;

Internal Quantum Efficiency=emitted light quantum number/absorbed light quantum number As shown in Table 1, the fluoride fluorescent materials of Examples 1 to 4 each had a higher relative light emission intensity than the fluoride fluorescent material of Comparative Example 1 and had a high internal quantum efficiency of 85% or more. In particular, the fluoride fluorescent materials of Examples 1 to 3 each had an internal quantum efficiency of 90% or more. The fluoride fluorescent materials of Examples 1 to 4 each have a high light emission intensity with an internal quantum efficiency under excitation of light having a wavelength of 450 nm of 85% or more since the light emission spectrum thereof has the second light emission peak in a range of 625 nm or more and less than 635 nm and the first light emission peak having a full width at half maximum of 6 nm or less and a light emission intensity of 30% or more based on the light emission intensity at the second light emission peak as 100% in a range of 615 nm or more and less than 625 nm.

The fluoride fluorescent material of Comparative Example 1 had no light emission peak in a range of 615 nm or more and less than 625 nm, and the light emission intensity at the light emission peak in a range of 615 nm or more and less than 625 nm was less than 30% based on the light emission intensity at the light emission peak in a range of 625 nm or more and less than 635 nm as 100%.

The fluoride fluorescent material of Comparative Example 2 suffered relatively small influence of the heat treatment since the temperature of the heat treatment in an inert gas atmosphere was less than 400° C. Accordingly, the fluoride fluorescent material had a light emission peak in a range of 615 nm or more and less than 625 nm, but had a light emission intensity that was not enhanced but was lower than the fluoride fluorescent material of Comparative Example 1, and a low internal quantum efficiency.

The fluoride fluorescent material of Comparative Example 3 suffered relatively small influence of the heat treatment since the temperature of the heat treatment in an inert gas atmosphere was as low as 150° C., and had no light emission peak in a range of 615 nm or more and less than 625 nm. Accordingly, the light emission intensity thereof was lower than the fluoride fluorescent material of Comparative Example 1, and the internal quantum efficiency thereof was lowered.

The fluoride fluorescent material of Comparative Example 4 was subjected to the heat treatment without contact with a fluorine-containing substance, and therefore fluorine was not supplied to the composition of the fluoride fluorescent material. Accordingly, the light emission intensity thereof was lower than the fluoride fluorescent material of Comparative Example 1, and the internal quantum efficiency thereof was lowered.

The fluoride fluorescent material of Comparative Example 5 had a relative light emission intensity that was slightly higher than the fluoride fluorescent material of Comparative Example 1, and the light emission spectrum thereof had the first light emission peak in a range of 615 nm or more and less than 625 nm having a full width at half maximum of 6 nm or less. However, the crystal structure was distorted due to Si contained in the composition, and thereby the light emission intensity at the first light emission peak was small, and the internal quantum efficiency under excitation of light having a wavelength of 450 nm did not reach 85%.

The fluoride fluorescent material of Comparative Example 6 had a relative light emission intensity that was higher than the fluoride fluorescent material of Comparative Example 1, but the light emission intensity at the light emission peak in a range of 615 nm or more and less than 625 nm was small, and the internal quantum efficiency under excitation of light having a wavelength of 450 nm was lowered. It is estimated that the fluoride fluorescent material of Comparative Example 6 has a distorted crystal structure due to Si contained in the composition. By subjecting the fluoride particles having the distorted crystal structure to the heat treatment at a temperature of 400° C., the crystal structure is changed from a crystal structure similar to the $K_2MnF_6$ crystal structure to a crystal structure similar to the $K_2SiF_6$ crystal structure. It is estimated that in the light emission spectrum, consequently, the light emission intensity at the light emission peak in a range of 615 nm or more and less than 625 nm is decreased.

As shown in FIG. 2, the fluoride fluorescent material of Example 1 had the light emission spectrum having the first light emission peak in a range of 615 nm or more and less than 625 nm having a full width at half maximum of 6 nm or less, and the second light emission peak in a range of 625 nm or less and less than 635 nm. As shown in FIG. 3, on the other hand, the fluoride fluorescent material of Comparative Example 1 had the light emission peak in a range of 625 nm or more and less than 635 nm, but had no light emission peak in a range of 615 nm or more and less than 625 nm. It was confirmed from the results that the fluoride fluorescent material of Example 1 had the changed crystal structure, which was different from the fluoride fluorescent material having no first light emission peak in a range of 615 nm or more and less than 625 nm.

As shown in FIG. 4, the X-ray diffraction pattern of the fluoride fluorescent material of Example 1 having a composition represented by $K_2[Ge_{0.95}Mn^{4+}{}_{0.05}F_6]$ had peaks at the positions in diffraction angle 2θ that were different from the X-ray diffraction pattern of the fluoride fluorescent material of Comparative Example 1 having a composition represented by $K_2[Ge_{0.95}Mn^{4+}{}_{0.05}F_6]$, from which it was confirmed that the fluoride fluorescent material of Example 1 had the changed crystal structure, which was different from the fluoride fluorescent material of Comparative Example 1. The fluoride fluorescent material of Comparative Example 1 had a $K_2GeF_6$ crystal structure.

As shown in FIG. 5, the X-ray diffraction pattern of the fluoride fluorescent material of Example 1 having a composition represented by $K_2[Ge_{0.95}Mn^{4+}{}_{0.05}F_6]$ had peaks at the positions in diffraction angle 2θ that were approximately the same as the X-ray diffraction pattern of the crystal structure model of $K_2MnF_6$ according to ICDD Card No. 01-077-2133, from which it was confirmed that the fluoride fluorescent material of Example 1 had the crystal structure that was changed from the $K_2GeF_6$ crystal structure to the crystal structure similar to the $K_2MnF_6$ crystal structure.

As shown in FIG. 6, the fluoride fluorescent material of Reference Example 1 having a composition represented by $K_2SiF_6$:$Mn^{4+}$ had no light emission peak in a range of 615 nm or more and less than 625 nm, or had only a small peak therein that could not be recognized as a peak. As shown in FIG. 7, the fluoride fluorescent material of Reference Example 2, which was obtained by bringing the fluoride fluorescent material of Reference Example 1 into contact with the fluorine-containing substance and subjecting to the heat treatment in an inert gas atmosphere at 400° C., also had no light emission peak in a range of 615 nm or more and less than 625 nm, or had only a small peak therein that could not be recognized as a peak.

As shown in FIG. 8, the X-ray diffraction pattern of the fluoride fluorescent material of Comparative Example 1 having a composition represented by $K_2SiF_6$:$Mn^{4+}$ and the X-ray diffraction pattern of the fluoride fluorescent material of Comparative Example 2 obtained by subjecting the fluoride fluorescent material of Comparative Example 1 to the heat treatment had peaks at the positions in diffraction angle 2θ that were approximately the same as each other, from which no change in crystal structure by the heat treatment was confirmed.

The fluoride fluorescent material of the present disclosure can be favorably applied particularly to light sources using a light emitting diode as an excitation light source, such as light sources for illumination, light sources for an image display device, e.g., an LED display and a backlight for a liquid crystal display, traffic signals, illuminated switches, various sensors, various indicators, small-sized strobe lights.

The invention claimed is:

1. A method for producing a fluoride fluorescent material, wherein the fluoride fluorescent material has a hexagonal crystal structure, P63mc space group symmetry, the method comprising:
preparing a precipitate including fluoride particles comprising a composition comprising K, Ge, $Mn^{4+}$, and F, and having a molar ratio of K of 2, a total molar ratio of Ge and $Mn^{4+}$ of 1, a molar ratio of $Mn^{4+}$ of more than 0 and less than 0.2, and a molar ratio of F of 6 in 1 mol of the composition by mixing a first solution containing at least potassium ion and hydrogen fluoride, a second solution containing at least a first complex ion including tetravalent manganese and hydrogen fluoride, and a third solution containing at least a second complex ion including germanium and fluoride ion;
rinsing the precipitate with a rinsing liquid after solid-liquid separation of the precipitate to obtain the fluoride particles;
drying the fluoride particles at a temperature in the range of 50° C. or more and 110° C. or less; and
bringing the dried fluoride particles into contact with a fluorine-containing substance, and subjecting to a heat treatment at a temperature in an inert gas atmosphere at a temperature in a range of 450° C. or more and 550° C. or less.

2. The method for producing a fluoride fluorescent material according to claim 1, wherein the fluoride particles are subjected to the heat treatment in an inert gas atmosphere containing nitrogen.

3. The method for producing a fluoride fluorescent material according to claim 1, wherein the fluorine containing substance is at least one selected from the group consisting of $F_2$, $CHF_3$, $CF_4$, $NH_4HF_2$, $NH_4F$, $SiF_4$, and $NF_3$.

4. The method for producing a fluoride fluorescent material according to claim 1, wherein the composition is represented by the following formula (I):

$$K_2[Ge_{1-a}Mn^{4+}{}_aF_6] \quad (I)$$

wherein in the formula (I), a satisfies 0<a<0.2.

5. The method for producing a fluoride fluorescent material according to claim 1, wherein the fluoride fluorescent material has an internal quantum efficiency of 90% or more under excitation of light having a wavelength of 450 nm.

6. The method for producing a fluoride fluorescent material according to claim 1, wherein the fluorine-containing substance is fluorine gas, and the inert gas atmosphere further contains 3% by volume or more and 30% by volume or less of fluorine gas.

7. The method for producing a fluoride fluorescent material according to claim 1, wherein the hydrogen fluoride concentration in the first solution is in a range of 1% by mass or more and 80% by mass or less, the potassium ion concentration in the second solution is in a range of 1% by mass or more and 30% by mass or less, the hydrogen fluoride concentration in the second solution is in a range of 1% by mass or more and 80% by mass or less, the first complex ion in the second solution is in a range of 0.01% by mass or more and 5% by mass or less, the second complex ion in the third solution is in a range of 10% by mass or more and 60% by mass or less.

8. The method for producing a fluoride fluorescent material according to claim 1, wherein the rinsing liquid is at least one selected from the group consisting of ethanol, isopropyl alcohol, water and acetone.

9. The method for producing a fluoride fluorescent material according to claim 1, wherein the fluoride fluorescent material has a light emission spectrum having a first light emission peak in a range of 615 nm or more and less than 625 nm having a full width at half maximum of 6 nm or less, and a second light emission peak in a range of 625 nm or more and less than 635 nm.

10. The method for producing a fluoride fluorescent material according to claim 9, wherein the fluoride fluorescent material has the light emission spectrum having a light emission intensity of 30% or more at the first light emission peak based on the light emission intensity at the second light emission peak as 100%.

* * * * *